(12) United States Patent
Choi et al.

(10) Patent No.: US 7,799,633 B2
(45) Date of Patent: Sep. 21, 2010

(54) SEMICONDUCTOR DEVICE AND METHOD OF MANUFACTURING THE SAME

(75) Inventors: Young-moon Choi, Seoul (KR); Ji-young Kim, Yongin-si (KR); In-seok Yeo, Seoul (KR); Sun-woo Lee, Incheon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 386 days.

(21) Appl. No.: 11/980,355

(22) Filed: Oct. 31, 2007

(65) Prior Publication Data

US 2008/0135908 A1 Jun. 12, 2008

(30) Foreign Application Priority Data

Dec. 6, 2006 (KR) .................. 10-2006-0123369

(51) Int. Cl.
*H01L 21/8242* (2006.01)
*H01L 27/108* (2006.01)

(52) U.S. Cl. ............... 438/253; 438/256; 257/E21.647; 257/E21.648; 977/762; 977/766

(58) Field of Classification Search ............. 438/253, 438/256; 257/E21.646, E21.647, E21.648; 977/742, 762, 766
See application file for complete search history.

(56) References Cited

U.S. PATENT DOCUMENTS

| 6,628,053 | B1 * | 9/2003 | Den et al. .................. 313/310 |
| 2003/0134436 | A1 | 7/2003 | Yates et al. |
| 2003/0179559 | A1 * | 9/2003 | Engelhardt et al. .......... 361/780 |
| 2003/0211724 | A1 * | 11/2003 | Haase ....................... 438/629 |
| 2004/0058153 | A1 * | 3/2004 | Ren et al. .................. 428/408 |
| 2006/0157771 | A1 * | 7/2006 | Choi et al. .................. 257/306 |
| 2006/0169972 | A1 * | 8/2006 | Furukawa et al. ............ 257/20 |
| 2006/0244102 | A1 * | 11/2006 | Hoshino ..................... 257/534 |
| 2006/0249726 | A1 * | 11/2006 | Choi et al. .................... 257/9 |

(Continued)

FOREIGN PATENT DOCUMENTS

EP 1724785 A1 * 11/2006

(Continued)

OTHER PUBLICATIONS

Korean Office Action dated Mar. 12, 2008 in corresponding Korean Patent Application.

*Primary Examiner*—David Vu
*Assistant Examiner*—Earl N Taylor
(74) *Attorney, Agent, or Firm*—Harness, Dickey & Pierce, P.L.C.

(57) ABSTRACT

Provided are a semiconductor device and a method of manufacturing the semiconductor device, for example, a semiconductor device using carbon nanotubes or nanowires as lower electrodes of a capacitor, and a method of manufacturing the semiconductor device. The semiconductor device may include a lower electrode including a plurality of tubes or wires on a semiconductor substrate, a dielectric layer on the surface of the lower electrode, and an upper electrode on the surface of the dielectric layer, wherein the plurality of tubes or wires radiate outwardly from each other centering on the lower portion of the plurality of tubes or wires. Thus, the off current of the capacitor may be increased by increasing the surface area of the lower electrodes of the capacitor.

26 Claims, 5 Drawing Sheets

U.S. PATENT DOCUMENTS

| | | | |
|---|---|---|---|
| 2007/0051970 A1* | 3/2007 | Jang et al. | 257/108 |
| 2007/0059584 A1* | 3/2007 | Nakano et al. | 429/40 |
| 2007/0242417 A1* | 10/2007 | Mosley et al. | 361/508 |
| 2008/0218939 A1* | 9/2008 | Marcus et al. | 361/505 |
| 2010/0075130 A1* | 3/2010 | Meng et al. | 428/315.5 |

FOREIGN PATENT DOCUMENTS

| | | |
|---|---|---|
| JP | 2004-146520 | 5/2004 |
| KR | 10-2004-0069492 | 8/2004 |
| KR | 10-2005-0074703 | 7/2005 |
| KR | 10-2006-0000344 | 1/2006 |
| KR | 10-2006-0023064 | 3/2006 |

* cited by examiner

SEMICONDUCTOR DEVICE AND METHOD OF MANUFACTURING THE SAME

PRIORITY STATEMENT

This application claims priority under 35 U.S.C. §119 to Korean Patent Application No. 10-2006-123369, filed on Dec. 6, 2006, in the Korean Intellectual Property Office (KIPO), the entire contents of which are incorporated herein by reference.

BACKGROUND

1. Field

Example embodiments relate to a semiconductor device and methods of manufacturing the semiconductor device. Other example embodiments relate to a semiconductor device using carbon nanotubes (CNT) or nanowires and methods of manufacturing the semiconductor device.

2. Description of the Related Art

As the integration of semiconductor devices has increased, the area of a storage node, which stores data, has decreased, and thus the sensing margin of semiconductor devices has become harder to obtain. To overcome this problem, some solutions are to change the structure of a capacitor or replace the capacitor electrode with a metal and apply a relatively highly dielectric material. Accordingly, the surface area of an electrode of a capacitor may increase to guarantee the capacitance of the capacitor.

Accordingly, semiconductor devices having a capacitor with a lower electrode formed of carbon nanotubes have been suggested. According to conventional technology, a lower electrode and a dielectric layer, which is formed on the lower electrode, may be formed of carbon nanotubes in a bundle. However, the area of the electrode of the capacitor may be undesirably small.

SUMMARY

Example embodiments provide a semiconductor device and methods of manufacturing the same. According to example embodiments, a semiconductor device may include a lower electrode having a plurality of tubes or wires on a semiconductor substrate, a dielectric layer on the surface of the lower electrode, and an upper electrode on the surface of the dielectric layer, wherein each of the plurality of tubes or wires radiate outwardly from one another centering on the lower portion of the plurality of tubes or wires.

The lower portions of the plurality of tubes or wires may be parallel to one another. The distance between the plurality of tubes or wires in the upper portion may be greater than the distance between the plurality of tubes or wires in the lower portion. The plurality of tubes or wires may be charged with the same type of electrical charge so that the plurality of tubes or wires radiate outwardly from each other centering on the lower portion of the plurality of tubes or wires due to the electrical repulsive force. The plurality of tubes or wires may be carbon nanotubes, silicon nanowires or GaAs nanowires.

According to example embodiments, a method of manufacturing a semiconductor device may include forming a lower electrode including a plurality of tubes or wires that radiate outwardly from each other centering on the lower portion of the plurality of tubes or wires, forming a dielectric layer on the surface of the lower electrode, and forming an upper electrode on the surface of the dielectric layer.

Forming the lower electrode may include charging the surface of the plurality of tubes or wires with the same type of electrical charge so that the plurality of tubes or wires radiate outwardly from each other centering on the lower portion of the plurality of tubes or wires. Charging the surface of the plurality of tubes or wires with the same type of electrical charge may include applying a DC bias or an AC bias to the semiconductor substrate. Charging the surface of the plurality of tubes or wires with the same type of electrical charge may include placing the plurality of tubes or wires into a solvent having a higher polarity than the plurality of tubes or wires, or a relatively strong acidic or basic solvent.

According to example embodiments, a method of manufacturing a semiconductor device may include forming a plurality of catalytic particles on a semiconductor substrate, and forming a plurality of tubes or wires by growing tubes or wires on the catalytic particles, wherein forming the plurality of tubes or wires includes charging the plurality of tubes or wires with the same type of electrical charge so that the plurality of tubes or wires are separate from one another.

BRIEF DESCRIPTION OF THE DRAWINGS

Example embodiments will be more clearly understood from the following detailed description taken in conjunction with the accompanying drawings. FIGS. 1-3H represent non-limiting, example embodiments as described herein.

FIG. 1 is a cross-sectional view illustrating a semiconductor device according to example embodiments;

FIG. 2 is a perspective view illustrating a structure of a carbon nanotube; and

FIGS. 3A-3H are cross-sectional view for describing a method of manufacturing a semiconductor device according to example embodiments.

Figure 1:
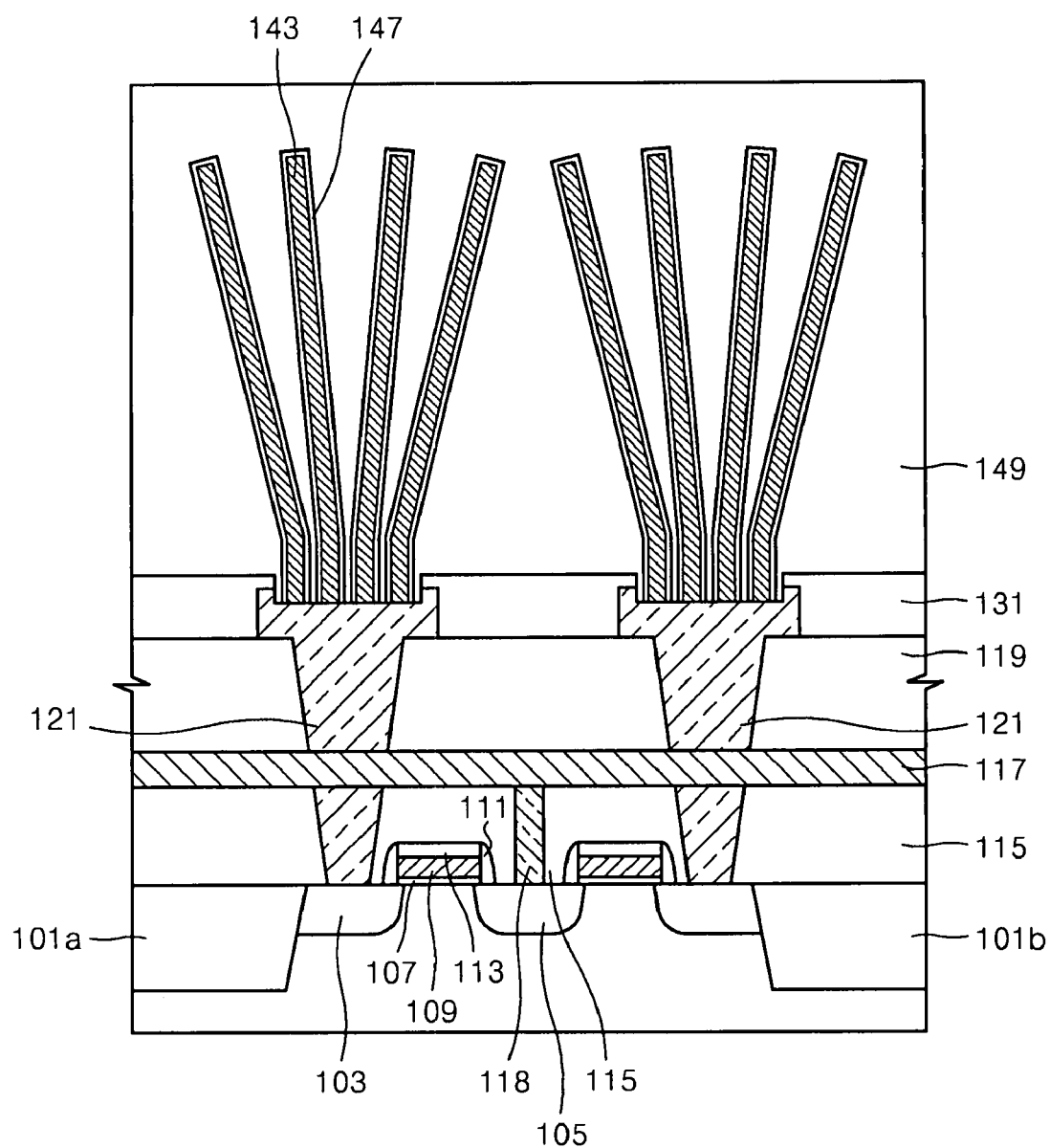

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. In particular, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will now be described more fully with reference to the accompanying drawings, in which example embodiments are shown. Example embodiments may, however, be embodied in many different forms and should not be construed as being limited to the embodiments set forth herein. Rather, these embodiments are provided so that this disclosure will be thorough and complete, and will fully convey the concept of example embodiments to one skilled in the art. In drawings, the thickness of layers and regions are exaggerated for better understanding of example embodiments. Like reference numerals refer to like elements. When one element such as a layer, a region or a substrate is mentioned to locate "on" another element, the one element can directly contact the other element or a still another element can be interposed between the one element and the other element.

Relative terms such as "lower," "bottom," and "upper" or "top" can be understood to include other directions in addition to a direction described in the drawings. For example, when a device is turned over in the drawings, elements described as locating on the lower surface of other elements can be located on the upper surface of the other elements. Therefore, the term "lower" herein can refer to both "lower" and "upper" according to the direction of the drawings. Likewise, when a device is turned over in one of the drawings, elements described as being disposed "below or beneath" the other elements can be disposed above the other elements. Thus, the term "below or beneath" can refer to both "below or beneath" and "above" according to the direction of the drawings.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view illustrating a semiconductor device according to example embodiments. Referring to FIG. 1, an active region may be defined by trenches 101a and 101b that are formed according to shallow trench isolation. A source 103 and a drain 105 may be formed in the active region. Also, gates including a gate oxide layer 107 and a conductor 109 may be formed above a channel region between the source and the drain 103 and 105.

The source 103 and the drain 105 may be formed by a conventional ion injection process using the gate as a mask. The gate oxide layer 107 may be formed of $SiO_2$ and the conductor 109 may be formed of polysilicon. The gate may further include side wall spacers 111 or a hard mask layer 113 to protect the polysilicon of the gate in a subsequent etching process and dope the source 103 and the drain 105 regions with a relatively high density of ions. A transistor may be defined by the source 103, the drain 105, and the gate formed on the active region. A first interlayer insulator 115 may be formed to bury the transistors. A bit line 117 may be formed on the first interlayer insulator 115, and the bit line 117 may be electrically connected to the drain 105 by a first contact plug 118. A second interlayer insulator 119 may be formed to cover the bit line 117. Second contact plugs 121 may be formed and connected to the source 103 of the active region.

A lower electrode 131 of a capacitor may be formed on the second contact plugs 121. The lower electrode 131 may have a plurality of tubes or wires 143. The plurality of tubes or wires 143 may be carbon nanotubes, silicon nanowires and/or GaAs nanowires. A dielectric layer 147 may be formed on the surface of each of the plurality of tubes or wires 143, and an upper electrode 149 may be formed to cover the plurality of tubes or wires 143 on the surface of the dielectric layer 147. The plurality of tubes or wires 143 may radiate outwardly from each other centering on the lower portion of the plurality of tubes or wires 143.

Herein, the term "radiate outwardly" means dispositions in which the distances among the plurality of tubes or wires 143 in the upper portion are greater than the distances among the plurality of tubes or wires 143 in the lower portion however, example embodiments may not be limited thereto. For example, the plurality of tubes or wires 143 in the lower portion may be separate from each other in the upper surface of the second contact plug 121 and the separation distance among the plurality of tubes or wires 143 may increase in the upper portion of the plurality of tubes or wires 143.

Thus, even when the lower portions of the plurality of tubes or wires 143 contact one another in the second contact plug 121, the plurality of tubes or wires 143 in the upper portion may be separate from each other and the separation distance may increase toward the upper portion of the plurality of tubes or wires 143. For example, the plurality of tubes or wires 143 may be disposed on each second contact plug 121 radiating toward the upper portion of the plurality of tubes or wires 143, the plurality of tubes or wires 143 in the lower portion may be separate from each other in the upper surface of the second contact plug 121, and the separation distance may increase toward the upper portion of the plurality of tubes or wires 143. Herein, the term "toward the upper" means a state in which the upper portion of the plurality of tubes or wires 143 are formed higher than the lower portion of the plurality of tubes or wires 143.

As the plurality of tubes or wires 143 radiate outwardly from each other centering on the lower portion of the plurality of tubes or wires 143 so that the separation distance among the plurality of tubes or wires 143 in the upper portion increases, the dielectric layer 147 may be more easily deposited on each of the plurality of tubes or wires 143, and thus, may increase the surface area of capacitor. The plurality of tubes or wires 143 may be separated from one another due to an electrical repulsive force as the surface of the plurality of tubes or wires 143 is charged with the same type of electrical charge.

Figure 2:
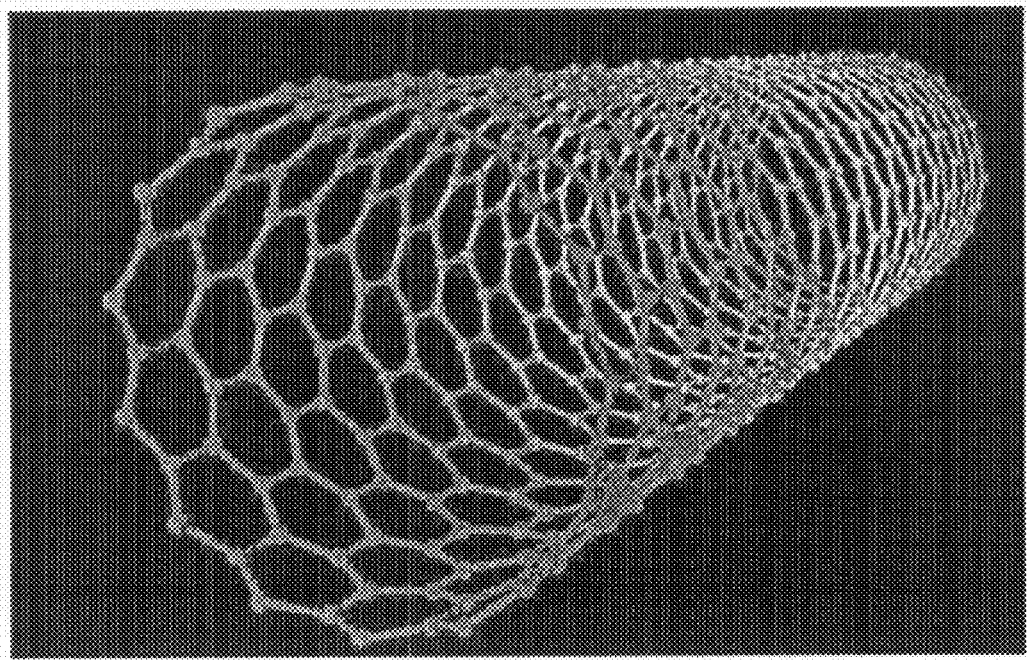

FIG. 2 is a perspective view illustrating a structure of a carbon nanotube. Referring to FIGS. 1 and 2, the plurality of tubes or wires 143 may be carbon nanotubes. A carbon nanotube may be a carbon allotrope in which carbons are combined with one another in a hexagonal honeycomb shape. The carbon nanotube illustrated in FIG. 2 is a single walled carbon nanotube (SWNT), however, carbon nanotubes according to example embodiments may also be multi walled carbon nanotubes (MWCN) in which SWNTs are multiply formed.

When the plurality of tubes or wires 143 are carbon nanotubes, a diffusion barrier (not shown) may be formed between the lower electrode 131 and the dielectric layer 147 to fill in gaps among the plurality of tubes or wires 143 and prevent or retard oxygen atoms of the dielectric layer 147 from diffusing to the lower electrode 131. The diffusion barrier may be formed of a conductor by a chemical vapor deposition (CVD) method or an atomic layer deposition (ALD) method and may include TiN.

Figure 3A:
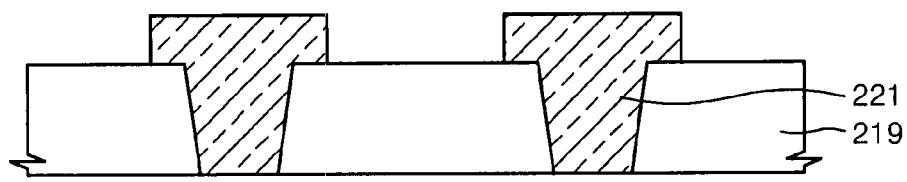

FIGS. 3A-3H are cross-sectional views for explaining a method of manufacturing a semiconductor device according to example embodiments. Referring to FIG. 3A, second contact plugs 221 may be formed on a semiconductor substrate in which a transistor, a first interlayer insulator burying the transistor, a bit line formed on the first interlayer insulator and the second interlayer insulator 219 burying the bit line are formed.

The second contact plugs 221 may be formed in the second interlayer insulator 219. The second contact plugs 221 may require second contact holes formed by patterning a photoresist coated on the surface of the second interlayer insulator 219 using a conventional photolithography process. A portion of the second interlayer insulator 219 in a predetermined or given region may be exposed by the patterning and an anisotropic dry etching process may be performed on the exposed portion of the second interlayer insulator 219. The anisotropic dry etching process may be performed on the first interlayer insulator under the second interlayer insulator 219 to expose a source region of the transistor. The second contact holes, which are formed by the anisotropic dry etching process, may be filled with conductive materials to form the second contact plugs 221. The second contact plugs 221 may be formed of W, Ti, Ta and/or polysilicon. For example, the second contact plugs 221 may be formed of W, which has improved step coverage and an improved gap filling capability.

Figure 3B:
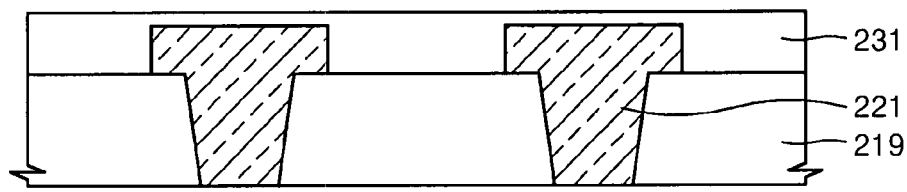
Figure 3C:
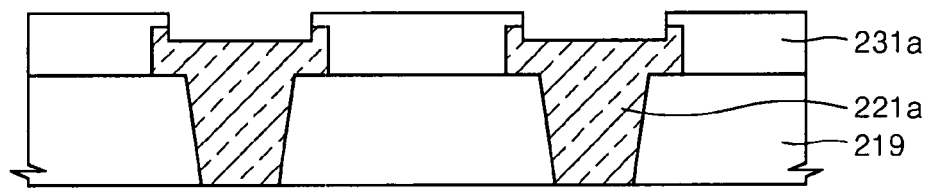

Referring to FIG. 3B, an etching stop layer 231 may cover the second contact plugs 221 formed on the semiconductor substrate. The etching stop layer 231 may be formed of SiN. The etching stop layer 231 may entirely cover the second contact plugs 221 and the second interlayer insulator 219. Referring to FIG. 3C, the upper surface of the etching stop layer 231 may be selectively etched and a portion of the second contact plug 221 may also be etched to form an etching stop layer pattern 231a and a second contact plug pattern 221a.

Figure 3D:
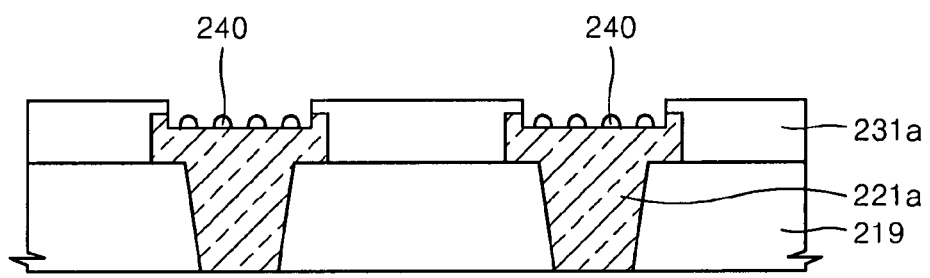

Referring to FIG. 3D, catalytic particles 240 may be formed on the second contact plug pattern 221a to grow carbon nanotubes. The catalytic particles 240, for growing carbon nanotubes, may include at least one element selected from the group consisting of Fe, Ni, Co and Pd. A catalytic metal material may be deposited on the second contact plug pattern 221a. The catalytic metal material may include at least one element selected from the group consisting of Fe, Ni, Co and Pd. The catalytic metal material may be deposited on an etching stop layer pattern 231a and the second contact plug pattern 221a exposed by the etching stop layer pattern 231a. If a photoresist pattern is formed on the etching stop layer pattern 231a, the catalytic metal material may be deposited on the photoresist pattern. The catalytic metal material deposited on the etching stop layer pattern 231a or the photoresist pattern may be removed by a chemical mechanical polishing (CMP) and/or an etch back process. The catalytic metal material deposited on the photoresist pattern may be removed also by lifting off the photoresist pattern. Therefore, the catalytic metal material may be formed only on the second contact plug pattern 221a.

An etching process may be performed to form the catalytic particles 240. The etching process may be a wet etching process using a HF solution. The semiconductor substrate, on which the catalytic metal material is deposited, may be dipped in the HF solution for several through hundreds of seconds to wet etch the surface of the catalytic metal material. The dipping time may be adjusted according to the size and the number of catalytic metal particles to be formed. A dry etching process using $NH_3$ gas may be performed as a post treatment after the wet etching process in the HF solution for an oriented growth of a plurality of carbon nanotubes 242. Although the catalytic particles 240 are formed by the wet etching process using the HF solution, the surface thereof may be rough.

Thus, catalytic particles 240, which are hemispherical, may be obtained by flowing $NH_3$ gas by a predetermined or given amount of time of several through tens of minutes into the semiconductor substrate. The catalytic particles 240, which are formed on the side walls of the etching stop layer pattern 231a, may be removed by the etching using the HF solution or $NH_3$ gas. Nanowires may be grown instead of the carbon nanotubes 240, according to example embodiments. For example, silicon nanowires or GaAs nanowires may be grown. The catalytic particles 240 may include at least one element selected from the group consisting of Au, Ti, and Pd, and etching processes for forming catalytic particles 240 may be the same as for the carbon nanotubes 242.

Figure 3E:
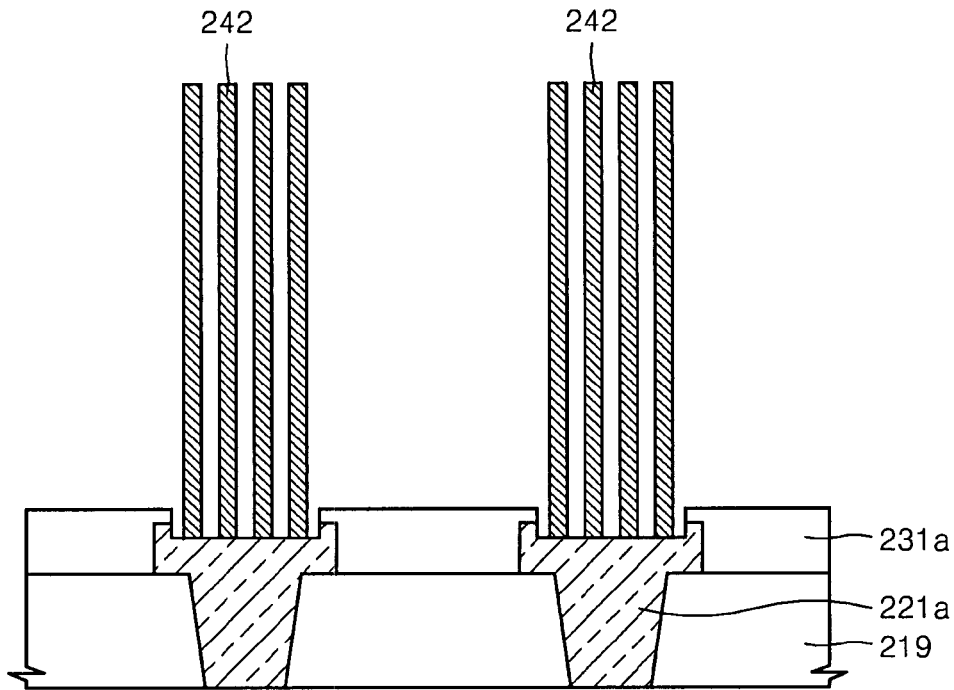

Referring to FIG. 3E, the carbon nanotubes 242 may be grown using the catalytic particles 240 to form a plurality of lower electrodes of a capacitor on each second contact plug pattern 221a. The etching stop layer pattern 231a may be formed to an appropriate height so that the carbon nanotubes 242 may be grown perpendicular to the surface of the second contact plug pattern 221a. The growth of the carbon nanotubes 242 may be performed by a plasma enhanced chemical vapor deposition (PECVD) and/or a thermal chemical vapor deposition (TCVD) process. The plasma may be created by RF (AC) frequency and/or DC discharge between two electrodes, where the area between the two electrodes is filled with a reaction gas. When the carbon nanotubes 242 are synthesized, the reaction gas may be a hydrocarbon gas and may include, for example, $CH_4$, $C_2H_2$ and/or $C_2H_4$. The synthesis temperature may be in the range of about 300° C.-about 900° C. In the TCVD process, the carbon nanotubes 242 may be grown by placing the semiconductor substrate in a reactor and supplying a reaction gas within a predetermined or given temperature range of about 300° C.-about 900° C., and the reaction gas may be a carbonized gas including carbon, e.g., $CH_4$, $C_2H_2$, $C_2H_4$, CO and/or alcohol.

When growing the carbon nanotubes 242 perpendicular to the second contact plug pattern 221a using the catalytic particles 240, the carbon nanotubes 242 may be formed in a bundle. Therefore, the carbon nanotubes 242 may be formed to contact to one another or may be formed separate from each other so that each separation distance is in the nanometer scale as illustrated in FIG. 3E. Because a dielectric layer 147 is relatively difficult to be deposited on each of the carbon nanotubes 242 in a bundle, the carbon nanotubes 242 may form one lower electrode. Referring to FIG. 3E, for example, one lower electrode of a capacitor may be formed on a second contact plug pattern 221a and two lower electrodes may be formed in total. For example, each lower electrode may be formed on each second contact play pattern 221a.

The carbon nanotubes 242, described in FIG. 3E, may be replaced with nanowires, e.g., silicon nanowires and/or GaAs nanowires. The reaction gas used for the nanowires may be different from the reaction gas used for the carbon nanotubes 242. For example, the reaction gas used for silicon nanowires may be $Si_xH_y$ gas, and the reaction gas used for GaAs nanowires may be $Ga_aH_b$ and $As_mH_n$ gases.

Figure 3F:
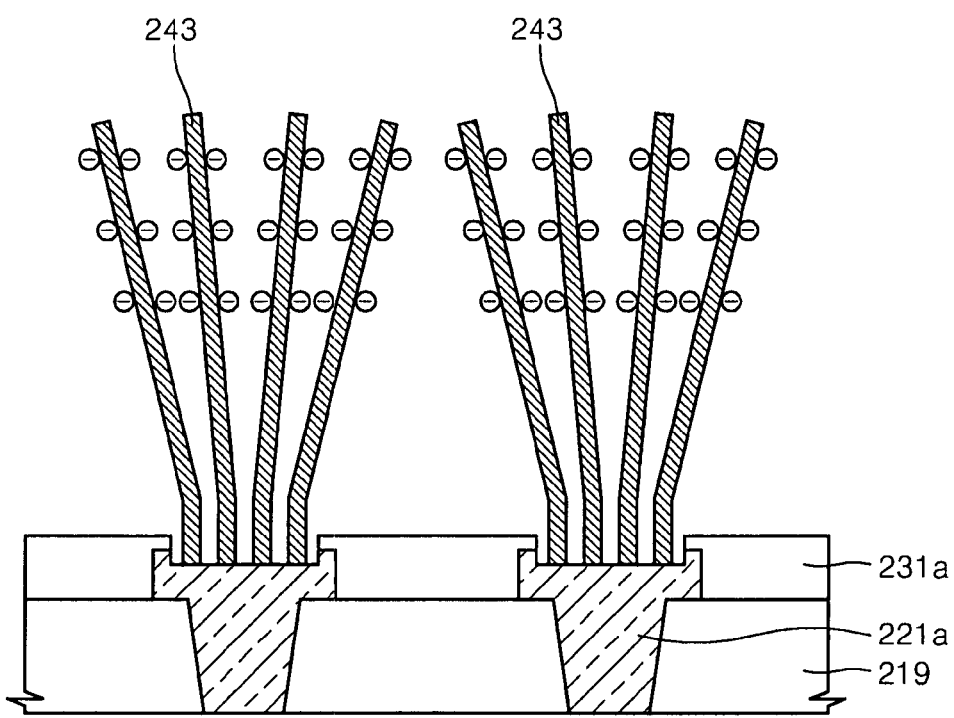

Referring to FIG. 3F, the carbon nanotubes 243 may radiate outwardly from one another centering on the lower portion of the carbon nanotubes 243. Herein, the term "radiate outwardly" means dispositions in which the distances among the carbon nanotubes 243 in the upper portion are greater than the distances among the carbon nanotubes 243 in the lower portion and are not limited to mathematical figures. For example, each of the carbon nanotubes 243 may be separate from one another due to an electrical repulsive force by charging the surface of the carbon nanotubes 243 with the same type of electrical charge.

According to example embodiments, a DC bias and/or an AC bias may be applied to the semiconductor substrate in which the carbon nanotubes 243 are charged with the same type of electrical charge. Applying the DC bias and/or the AC bias to the semiconductor substrate may include applying the DC bias and/or the AC bias to a chuck where the semiconductor substrate is installed. The same type of electrical charge may be a positive or a negative charge. Charging the surface of the plurality of tubes or wires with the same type of charge may be applied during the growth of the carbon nanotubes 243, or after the growth of the carbon nanotubes 243 prior to the deposition of the dielectric layer 247, or in conjunction with the deposition of the dielectric layer 247. The carbon nanotubes 243, illustrated in FIG. 3F, may be replaced with nanowires, e.g., silicon nanowires and/or GaAs nanowires. However, the nanowires may be formed as semiconductor nanowires to charge the nanowires with the same type of electrical charge and the semiconductor nanowires may be doped with an impurity.

Figure 3G:
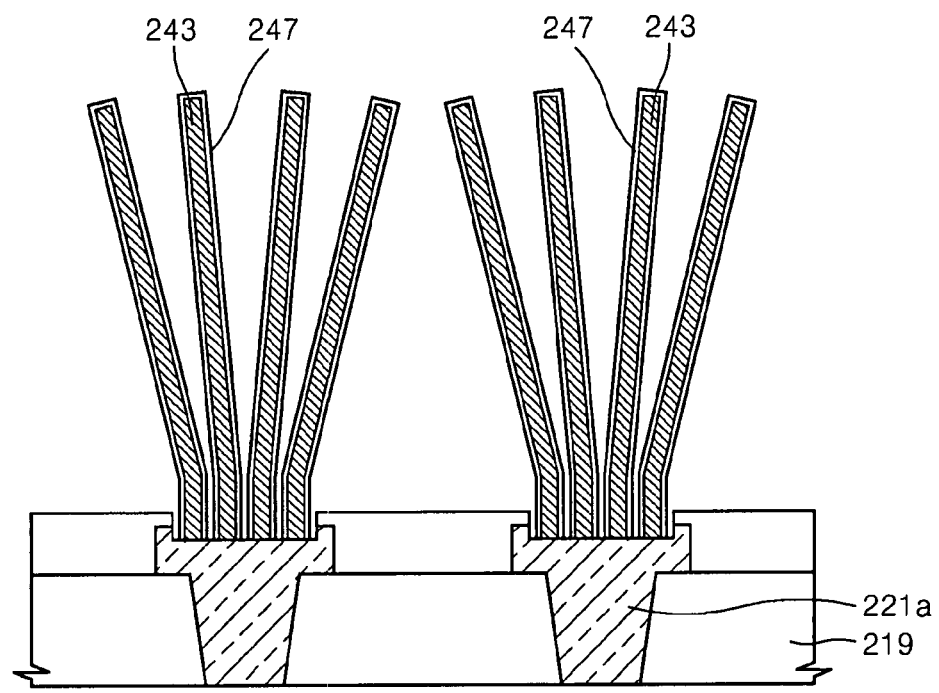

Referring to FIG. 3G, the carbon nanotubes 243 may radiate outwardly from each other centering on the lower portion of the carbon nanotubes 243 as the separation distance increases toward the upper portion of the lower electrodes, and thus, the dielectric layer 247 may be deposited on each of the carbon nanotubes 243. Accordingly, each of the carbon nanotubes 243 may function as a lower electrode, and thereby, may increase the surface area of capacitor. For example, referring to FIG. 3G, a total of eight lower electrodes may be formed with four electrodes of a capacitor on each second contact plug pattern 221a.

When the carbon nanotubes 243 form the lower electrodes of capacitor, a diffusion barrier (not shown) may be formed between the lower electrodes and the dielectric layer 247 to prevent or retard the constituent atoms of the dielectric layer 247, e.g., oxygen atoms, from diffusing to the lower electrodes. The diffusion barrier may be formed of a conductor by a chemical vapor deposition (CVD) and/or an atomic layer deposition (ALD) method, and may include titanium nitride (TiN).

Figure 3H:
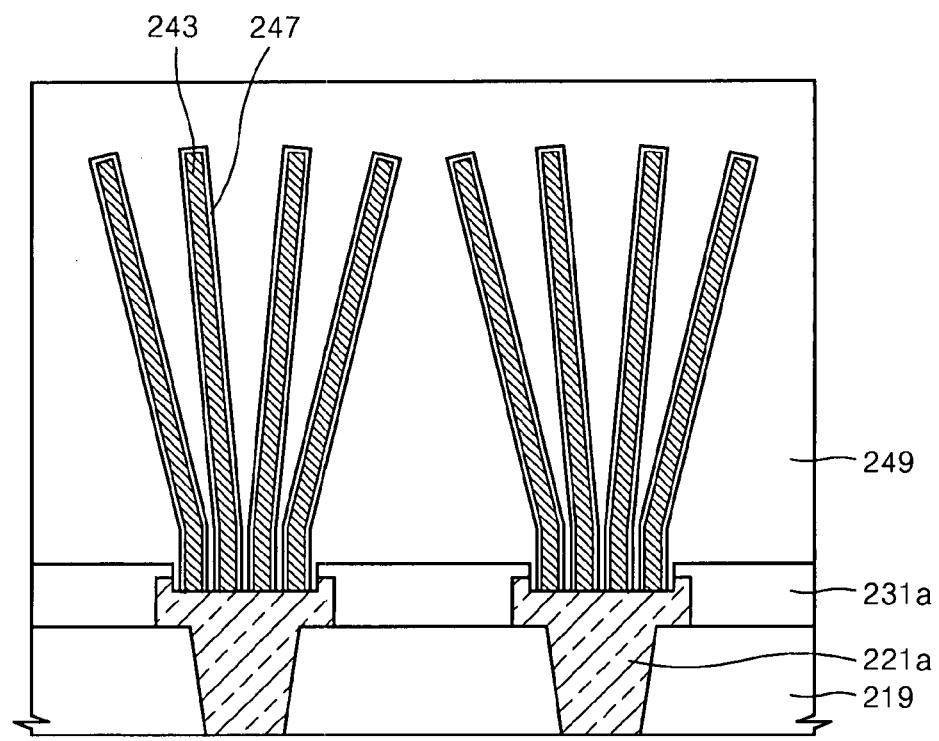

Referring to FIG. 3H, an upper electrode 249 may be formed on the dielectric layer 247. The upper electrode may be relatively thinly formed on the surface of the dielectric layer 247, or may also be relatively thickly formed to cover the dielectric layer 247 and the upper surface of the etching stop layer pattern 231a as illustrated in FIG. 3H. The carbon nanotubes 243, explained in FIG. 3E-3G, may be replaced with nanowires, e.g., silicon nanowires and/or GaAs nanowires. According to example embodiments, the carbon nanotubes 243 may be charged with the same type of electrical charge using a different method from example embodiments illustrated in FIG. 3F.

Referring to FIG. 3F, to charge the carbon nanotubes 243 with the same type of electrical charge, the carbon nanotubes 243 may be placed in a solution having a higher polarity than the carbon nanotubes 243 according to example embodiments. Dipoles may be formed on the surface of the carbon nanotubes 243 and the carbon nanotubes 243 may radiate outwardly from each other centering on the lower portion of the carbon nanotubes 243 due to the electrical repulsive force by the dipoles. The solvent may include dimethylformamide, dichloroethane, dichlorobenzene, alcohol and/or acetone. The same type of electrical charge may be a positive charge or a negative charge. Charging the surface of the plurality of tubes or wires with the same type of electrical charge may be applied during the growth of the carbon nanotubes 243, or after the growth of the carbon nanotubes 243 and prior to the deposition of the dielectric layer 247. The carbon nanotubes 243 may be charged simultaneously when the dielectric layer 247 is deposited.

In addition, applying the DC bias and/or the AC bias to the semiconductor substrate, which is placed in the solvent, may further be used. The distance between the carbon nanotubes 243 may be controlled by the direction of bias. Applying the DC bias and/or AC bias to the semiconductor substrate may include applying the DC bias and/or AC bias to the chuck where the semiconductor substrate is to be installed. The carbon nanotubes 243 may be replaced with nanowires, e.g., silicon nanowires and/or GaAs nanowires. However, the nanowires may be formed of a conductor or a semiconductor in order to charge the nanowires with the same type of electrical charge. Therefore, the nanowires may be doped with an impurity.

Example embodiments described above are the same except for the method of charging the carbon nanotubes with the same type of electrical charge which is described with reference to FIG. 3. Hereinafter, example embodiments in which the method of charging the carbon nanotubes with the same type of electrical charge is different from the example embodiments illustrated in FIG. 3F.

According to example embodiments, the carbon nanotubes 243 may be placed into a relatively strong acidic or basic solvent in order to charge the carbon nanotubes 243 with the same type of electrical charge. When the carbon nanotubes 243 are placed in the relatively strong acidic or basic solvent, dangling bonds of the $H^+$ group or $OH^-$ group may be formed on the surface of the carbon nanotubes 243. Accordingly, the carbon nanotubes 243 may radiate outwardly from each other centering on the lower portion of the carbon nanotubes 243 due to the electrical repulsive force of the dangling bonds. The same type of electrical charge may be a positive charge or a negative charge. Charging the carbon nanotubes 243 with the same type of electrical charge may be applied during the growth of the carbon nanotubes 243, or after the growth of the carbon nanotubes 243 and prior to the deposition of the dielectric layer 247. The carbon nanotubes 243 may be charged with the same type of electrical charge simultaneously while the dielectric layer 247 is being deposited.

In addition, applying a DC bias and/or an AC bias to the semiconductor substrate, which is placed in the solvent, may further be used. The distance between the carbon nanotubes may be controlled according to the direction of bias. Applying a DC bias and/or an AC bias to the semiconductor substrate is the same as applying a DC bias and/or an AC bias to the chuck where the semiconductor substrate is to be installed.

According to example embodiments, the carbon nanotubes 243 may be replaced with nanowires, e.g., silicon nanowires and/or GaAs nanowires. However, the nanowires may be formed of a conductor or a semiconductor in order to charge the nanowires with the same type of electrical charge. Therefore, the nanowires may be doped with an impurity.

Example embodiments may be the same except for the method of charging the carbon nanotubes with the same type of electrical charge. According to example embodiments of the semiconductor devices and the methods of manufacturing the same, the surface area of the lower electrodes of a capacitor may be increased, and thereby, may increase the off current of a capacitor.

While example embodiments have been particularly shown and described with reference to example embodiments thereof, it will be understood by one of ordinary skill in the art that various changes in form and details may be made therein without departing from the spirit and scope of the following claims. For example, when catalytic particles are formed on a semiconductor substrate and a plurality of wires or tubes are grown and formed on the catalytic particles, charging the carbon nanotubes constituting the lower electrodes of a capacitor with the same type of electrical charge as explained above may vary so as to separate the plurality of wires or tubes on the catalytic particles on the semiconductor substrate.

What is claimed is:

1. A method of manufacturing a semiconductor device comprising:
   forming a lower electrode including a plurality of tubes or wires that radiate outwardly from each other centering on lower portions of the plurality of tubes or wires;
   forming a dielectric layer on the surface of the lower electrode; and
   forming an upper electrode on the surface of the dielectric layer;
   wherein forming the lower electrode includes charging surfaces of the plurality of tubes or wires with the same type of electrical charge so that the plurality of tubes or wires radiate outwardly from each other centering on the lower portions of the plurality of tubes or wires.

2. The method of claim 1, wherein the lower portions of the plurality of tubes or wires are parallel to one another.

3. The method of claim 2, wherein a distance between the plurality of tubes or wires in an upper portion is greater than a distance between the plurality of tubes or wires in the lower portions.

4. The method of claim 1, wherein charging the surfaces of the plurality of tubes or wires with the same type of electrical charge includes applying a DC bias or an AC bias to a semiconductor substrate.

5. The method of claim 1, wherein charging the surfaces of the plurality of tubes or wires with the same type of electrical charge includes placing the plurality of tubes or wires into a solvent having a higher polarity than the plurality of tubes or wires.

6. The method of claim 4, wherein applying the DC bias or the AC bias to the semiconductor substrate includes placing the semiconductor substrate in the solvent having a higher polarity than the plurality of tubes or wires.

7. The method of claim 1, wherein charging the surfaces of the plurality of tubes or wires with the same type of electrical charge includes placing the plurality of tubes or wires into a strong acidic or basic solvent.

8. The method of claim 4, wherein applying the DC bias or the AC bias to the semiconductor substrate includes placing the semiconductor substrate in a strong acidic or basic solvent.

9. The method of claim 1, wherein the plurality of tubes or wires are formed by a plasma chemical vapor deposition method or a thermal chemical vapor deposition method.

10. The method of claim 9, wherein forming the lower electrode includes:
    forming a plurality of catalytic particles on a semiconductor substrate; and
    depositing a reaction gas on the catalytic particles.

11. The method of claim 10, wherein forming the catalytic particles includes:
    forming a catalytic metal layer on the semiconductor substrate; and
    etching the catalytic metal layer using a hydrofluoric (HF) solution.

12. The method of claim 11, further comprising:
    a post treatment using $NH_3$ gas after the etching using the HF solution.

13. The method of claim 10, wherein the catalytic particles include at least one element selected from the group consisting of Fe, Ni, Co and Pd, and the plurality of tubes or wires are carbon nanotubes.

14. The method of claim 13, further comprising:
    forming a diffusion barrier between the lower electrode and the dielectric layer.

15. The method of claim 14, wherein the diffusion barrier includes TiN.

16. The method of claim 13, wherein the reaction gas is a hydrocarbon gas.

17. The method of claim 16, wherein the hydrocarbon includes $CH_4$, $C_2H_2$ or $C_2H_4$.

18. The method of claim 10, wherein the catalytic particles include at least one element selected from the group consisting of Au, Ti and Pd, and the plurality of tubes or wires are silicon nanowires or GaAs nanowires.

19. A method of manufacturing a semiconductor device comprising:
  forming a plurality of catalytic particles on a semiconductor substrate; and
  forming a plurality of tubes or wires by growing tubes or wires on the catalytic particles,
  wherein forming the plurality of tubes or wires includes charging the plurality of tubes or wires with the same type of electrical charge so that the plurality of tubes or wires are separate from one another.

20. The method of claim 19, wherein charging the plurality of tubes or wires with the same type of electrical charge includes applying a DC bias or an AC bias to the semiconductor substrate.

21. The method of claim 19, wherein charging the plurality of tubes or wires with the same type of electrical charge includes placing the plurality of tubes or wires into a solvent having a higher polarity than the plurality of tubes or wires.

22. The method of claim 20, wherein applying the DC bias or the AC bias to the semiconductor substrate includes placing the semiconductor substrate in the solvent having a higher polarity than the plurality of tubes or wires.

23. The method of claim 19, wherein charging the plurality of tubes or wires with the same type of electrical charge includes placing the plurality of tubes or wires into a strong acidic or basic solvent.

24. The method of claim 20, wherein applying the DC bias or the AC bias to the semiconductor substrate includes placing the semiconductor substrate in a strong acidic or basic solvent.

25. The method of claim 19, wherein the catalytic particles include at least one element selected from the group consisting of Fe, Ni, Co and Pd, and the plurality of tubes or wires are carbon nanotubes.

26. The method of claim 19, wherein the catalytic particles include at least one element selected from the group consisting of Au, Ti and Pd, and the plurality of tubes or wires are silicon nanowires or GaAs nanowires.

* * * * *